United States Patent [19]
Kim et al.

[11] Patent Number: 5,990,016
[45] Date of Patent: Nov. 23, 1999

[54] DRY ETCHING METHOD AND APPARATUS FOR MANUFACTURING A SEMICONDUCTOR DEVICE

[75] Inventors: Byong-dong Kim, Suwon; Jung-kyu Lee; Sung-il Kim, both of Seoul, all of Rep. of Korea

[73] Assignee: Samsung Electronics Co., Ltd., Suwon, Rep. of Korea

[21] Appl. No.: 08/997,382

[22] Filed: Dec. 23, 1997

[30] Foreign Application Priority Data

Dec. 24, 1996 [KR] Rep. of Korea ............... 96 70899

[51] Int. Cl.⁶ .................................. H01L 21/00
[52] U.S. Cl. ..................... 438/707; 156/345; 216/71; 438/729
[58] Field of Search ............... 156/345 P, 345 V, 156/345 C, 345 PT, 345 PH; 216/67, 71; 438/707, 710, 729; 204/298.31, 298.34

[56] References Cited

U.S. PATENT DOCUMENTS

| | | | |
|---|---|---|---|
| 4,230,515 | 10/1980 | Zajac ............................ | 438/729 |
| 4,297,162 | 10/1981 | Mundt et al. ................. | 438/729 |
| 5,155,331 | 10/1992 | Horiuchi et al. ............. | 438/729 X |
| 5,439,524 | 8/1995 | Cain et al. .................... | 156/345 X |
| 5,556,521 | 9/1996 | Ghanbari ....................... | 156/345 X |
| 5,565,074 | 10/1996 | Qian et al. . | |
| 5,614,055 | 3/1997 | Fairbairn et al. . | |
| 5,628,869 | 5/1997 | Mallon .......................... | 216/71 X |
| 5,685,941 | 11/1997 | Forster et al. . | |

FOREIGN PATENT DOCUMENTS

| | | |
|---|---|---|
| 0 608 633 A2 | 12/1993 | European Pat. Off. . |
| WO 91 02106 | 2/1991 | WIPO . |
| WO 94 14185 | 6/1994 | WIPO . |

*Primary Examiner*—William Powell
*Attorney, Agent, or Firm*—Jones Volentine, LLP

[57] ABSTRACT

A dry etching method and apparatus improves the uniformity of etching a wafer in the manufacture of a semiconductor device. The dry etching apparatus has a susceptor supporting the wafer, a cooling system installed in the susceptor, an upper RF (radio frequency) electrode which may incorporate a gas diffuser for spraying reactive gas toward the wafer, and an RF power source for producing an electric field used to react the gas and generate plasma. The gap between the upper RF electrode and the susceptor is configured to accommodate for distortions in the wafer or other processing requirements. In addition, the nozzles of the gas diffuser can be configured to spray different amounts of gas to also enhance the etching uniformity. Finally, one of the electrodes may be divided into concentric sections. In this case, the RF power source can generate electric fields of different intensities at the sections. When the divided electrode is the susceptor, the cooling system cools the sections to different temperatures to in turn temperature-condition the wafer in a manner determined in advance to enhance the uniformity of the etching process.

22 Claims, 6 Drawing Sheets

DRY ETCHING METHOD AND APPARATUS FOR MANUFACTURING A SEMICONDUCTOR DEVICE

BACKGROUND OF THE INVENTION

1. Field of the Invention

The present invention relates to a dry etching method and apparatus for manufacturing a semiconductor device, and more particularly, to a dry etching apparatus for enhancing the uniformity of etching a wafer used to manufacture a semiconductor device.

2. Description of the Related Art

As semiconductor devices become more highly integrated, more precise wafer engineering skills and methods are needed to manufacture a very highly-integrated semiconductor device. Accordingly, the etching process, which is an important semiconductor manufacturing process, must become more precise.

Efficient etching generally requires variable selection, a high etching rate, uniformity, stability, and resultant low damage to the semiconductor substrate. Also, precise etching involves accurately controlling the etching rate according to the way in which a wafer to be processed is situated.

Known etching processes are roughly divided into dry etching and wet etching, which are selectively employed because the characteristics of each process have their own particular advantages and disadvantages. Wet etching is widely used and has advantages of low cost, high selectivity, high etching rate, and high reliability. However, wet etching can not be used to precisely etch a narrow line width and it is subject to the problem of undercutting since the chemical etching process is isotropic.

Dry etching encompasses several different types of processes, including: physical etching, such as Ion Milling; physical and chemical etching such as Reactive Ion Etching (RIE); and chemical etching, such as plasma etching. Physical etching results in a more precise pattern transfer as it is an anisotropic process, but it has a low selectivity rate. On the contrary, high selectivity is a characteristic of plasma etching, but plasma etching is also an isotropic process subject to the problem of undercutting.

Many factors contribute to the quality and quantity of etching in a plasma etching process, including the types of cooling gas, the temperature and pressure of the processing chamber, the distribution and density of the plasma particles of the cooling gas, the energy level of the plasma and the like. These factors closely correlate with the energy applied to the etching equipment and its structure.

Etching equipment is divided into two categories; batch-type equipment, which processes a plurality of wafers at one time, and single-type equipment, which processes wafers one by one. Conventionally, a batch-type etching process is widely used for small-diameter wafers because the non-uniformity of etching within a wafer or between wafers is not a big problem for the small-diameter wafers.

On the other hand, the non-uniformity of etching within or between wafers having larger diameters, e.g., 8 inches or 12 inches, is a major concern. Therefore, single-type etching equipment is preferably used to etch such large wafers in order to provide more uniformly etched wafers.

However, the uniformity of the etching process is still problematic due to many other operational parameters of the equipment. This problem is especially serious when manufacturing highly-integrated semiconductor devices. Some of the factors having an impact on the etching uniformity are described as follows, referring to the attached drawings.

Figure 1:
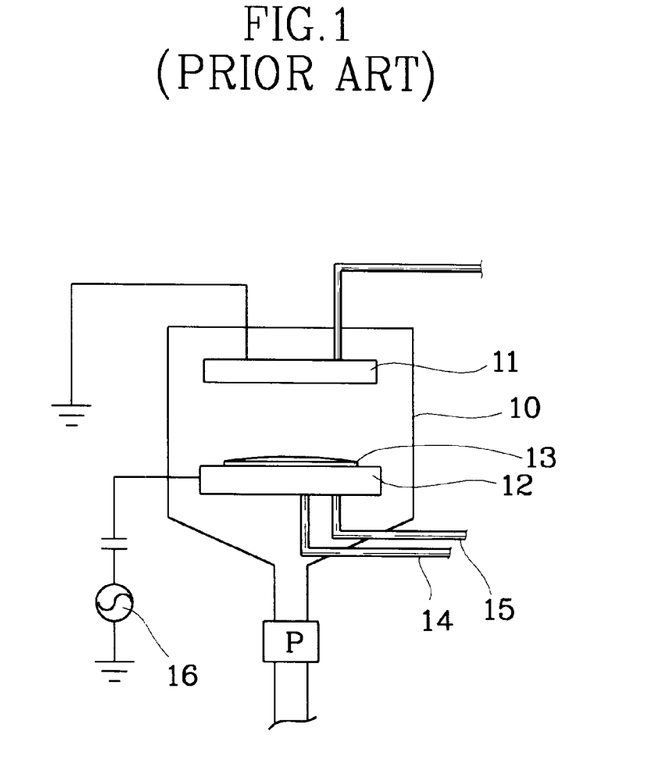
FIG. 1 is a schematic diagram of an embodiment of the processing chamber of the conventional plasma dry etching apparatus.

FIG. 1 is a schematic view of an embodiment of a conventional etching apparatus, wherein the apparatus comprises a susceptor 12 supporting a wafer 13 inside a processing chamber 10, a high frequency voltage power source 16 for the susceptor, and an electrode 11 facing the susceptor 12.

The susceptor 12 functions as a lower electrode. The RF power source 16 is connected to the susceptor 12 through a condenser to supply high frequency power thereto. In addition, helium is supplied to the backside of susceptor 12 through helium supply tubes 14 and 15. The former tube 14 is used for improving the etching uniformity by maintaining the temperature of the wafer at a uniform level, and the latter tube 15 is used for cooling the susceptor 12. The upper electrode 11 facing the susceptor 12 is usually made of a metal plate or coil and is grounded. Alternatively, the upper electrode 11 may have a high frequency power source connected thereto whereas the susceptor 12 is grounded. The upper electrode 11 includes a gas diffuser having a plurality of nozzle openings and an induction coil, both of which are integral parts of the upper electrode.

Whereas the upper electrode 11 has a flat shape, the lower electrode 12 has a convex shape in most cases due to the helium supplied to the wafer. The helium, which is used for improving the uniformity of the etching process, is diffused through tubes 14 onto the center of the backside of the wafer 13 at a pressure that is slightly higher than the pressure inside the processing chamber 10. Consequently, the wafer 13 is flexed convexly, or upward as shown in FIG. 1.

Also, the applied high frequency electric field is more intense at the middle of the wafer 13 than at its periphery such that the plasma particles become more highly concentrated at its middle even with the uniform cooling gas being supplied. Therefore, it is difficult to obtain uniformity in the etching process as well as maintaining the etching rate at a desired level.

Figure 2:
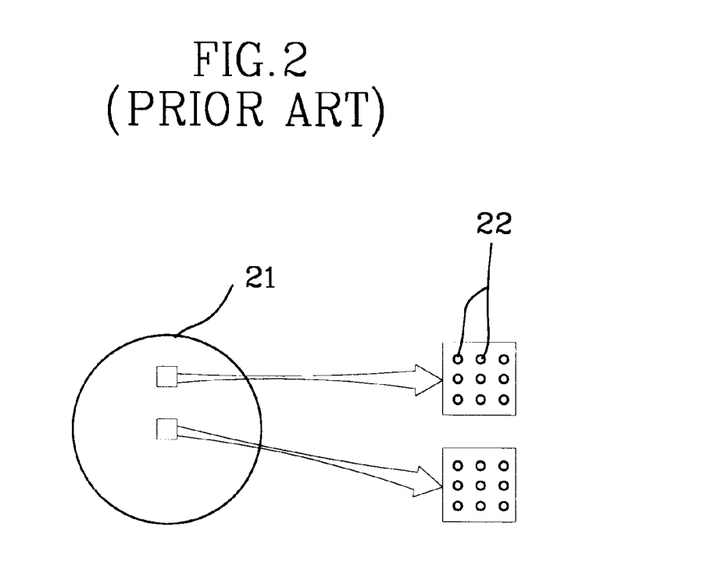
FIG. 2 is a schematic representation showing the distribution density of a plurality of nozzle openings of the gas diffuser of the conventional dry etching apparatus.

FIG. 2 shows the distribution density of a plurality of nozzle openings of the conventional gas diffuser of the upper electrode. The round-plate shaped gas diffuser 21 has a plurality of gas nozzle openings 22 that are uniformly distributed over the surface of the gas diffuser 21.

The density of source gas is always slightly less at the edge of the wafer because the by-product reaction gas is discharged from the periphery of the wafer to the side-wall of the processing chamber. Therefore, it is usually necessary to increase the density of the source gas at the edge of the wafer to compensate for this.

Figure 3:
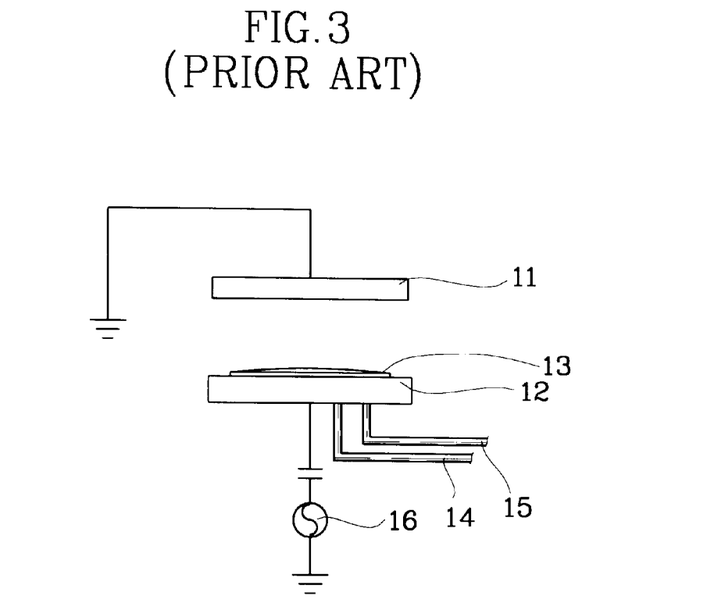
FIG. 3 is a schematic diagram of the conventional dry etching apparatus, wherein RF (Radio Frequency) power is applied to the susceptor on which a wafer is mounted.

FIG. 3 is another schematic view of the RF power source applied to the susceptor 12 on which a wafer 13 is mounted in a processing chamber (not shown). The RF power is a significant factor affecting the etching rate, but it is difficult to partially control the applied RF electric field in the etching apparatus as shown in FIG. 3. Furthermore, the etching rate varies within the wafer 13 according to the temperature differences therewithin. These temperature differences are difficult to control and compensate for using the conventional etching apparatus because the backside cooling helium is supplied in a uniform, continuous manner at a constant density.

Accordingly, these factors affecting the etching rate should be controlled to maintain the density of the activated plasma along the wafer surface at a constant level.

SUMMARY OF THE INVENTION

The present invention is directed to a dry etch apparatus for improving etch uniformity that substantially overcomes one or more of the problems of the related art.

To achieve these and other objects, the dry etch apparatus comprises a susceptor on which a wafer is mounted, an upper RF electrode, a cooling means installed in the susceptor, and an RF power source which generates an electric field to produce a plasma in a gap defined between the upper RF electrode and the susceptor. The upper RF electrode is configured so that the width of the gap between the upper and lower electrodes initially varies as taken across the surfaces of the electrodes.

The dry etching apparatus may also employ a gas diffuser for spraying cooling gas toward the surface of the susceptor on which the wafer is mounted. The nozzles of the diffuser are configured so that the amount of sprayed gas per unit area varies across the surface of the susceptor.

In another embodiment of the dry etching apparatus, one of the RF electrodes is divided into a plurality of electrically insulated sections, and each section has a different level of RF power applied thereto.

In still another embodiment of the dry etch apparatus, the cooling means causes the susceptor to have different temperatures at respective thermally insulated portions thereof.

As described above with respect to the related art, the density of the activated plasma particles changes during the etching operation for various reasons. Therefore, the embodiments of the present invention allow the density of the plasma particles to be uniformly maintained over the entire surface of the wafer to be etched.

BRIEF DESCRIPTION OF THE DRAWINGS

Further objects and advantages of the invention will be more fully understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 4:
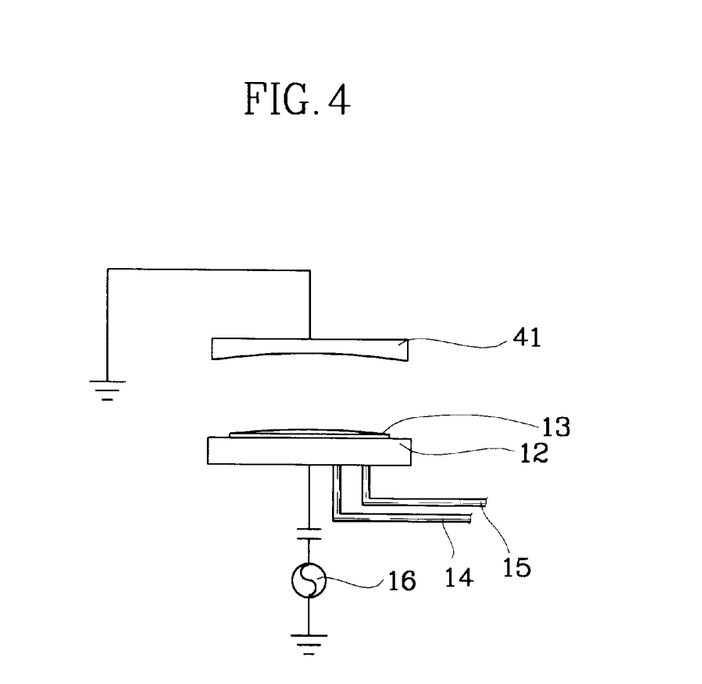
FIG. 4 and FIG. 5 are schematic diagrams of embodiments of the dry etching apparatus according to the present invention, wherein the upper RF electrodes are concave.
Figure 5:
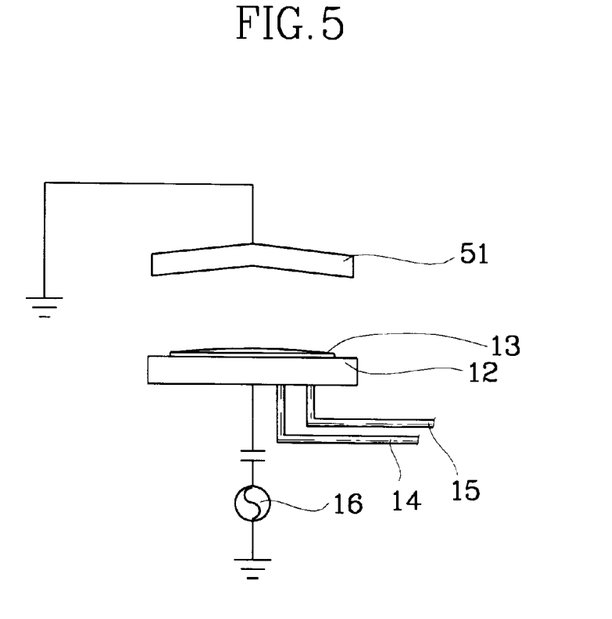
Figure 6:
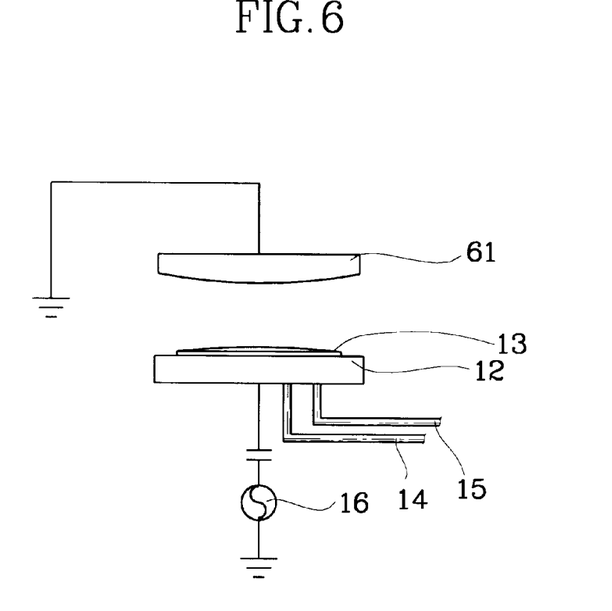
FIG. 6 and FIG. 7 are schematic configurations of embodiments of the dry etching apparatus according to the present invention, wherein the upper RF electrodes are convex.
Figure 7:
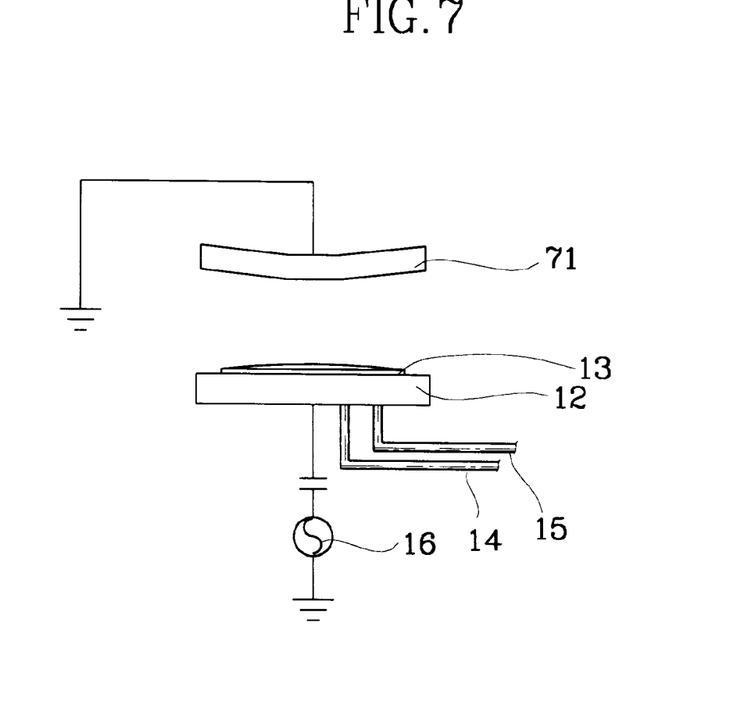

FIG. 4 and FIG. 5 show embodiments of the dry etching apparatus according to the present invention, wherein the upper RF electrodes are concave. FIG. 6 and FIG. 7 show embodiments of the dry etching apparatus according to the present invention, wherein the upper RF electrodes are convex.

The upper electrodes 41 and 61 in FIG. 4 and FIG. 6 have smooth curved surfaces of a certain uninterrupted curvature. The surfaces of upper electrodes 51 and 71 in FIG. 5 and FIG. 7 are composed of a combination of planar surfaces, each of which meets the next with an angle subtended thereby. These planar surfaces form an overall convex or concave surface. Still further, the surface of the upper electrode may be conical, or any other shape that is symmetrical about a point located at the center of the surface as long as the shape gives rise to an overall concave or convex surface.

Accordingly, the width of the gap between the surface of the respective upper electrodes 41, 51, 61, 71 and the surface of the susceptor 12 on which the wafer 13 is supported initially varies as taken across the two opposing surfaces. Thus, RF power applied to the surfaces produces plasma particles of a density that accounts for distortions in the wafer. When the wafer 13 is flexed at its middle portion during processing, the surface of the upper electrode should be concave as shown in FIG. 4 and FIG. 5. If the wafer does not require processing at its central portion, the surface of the upper electrode should be convex as shown in FIG. 6 and FIG. 7.

Figure 8:
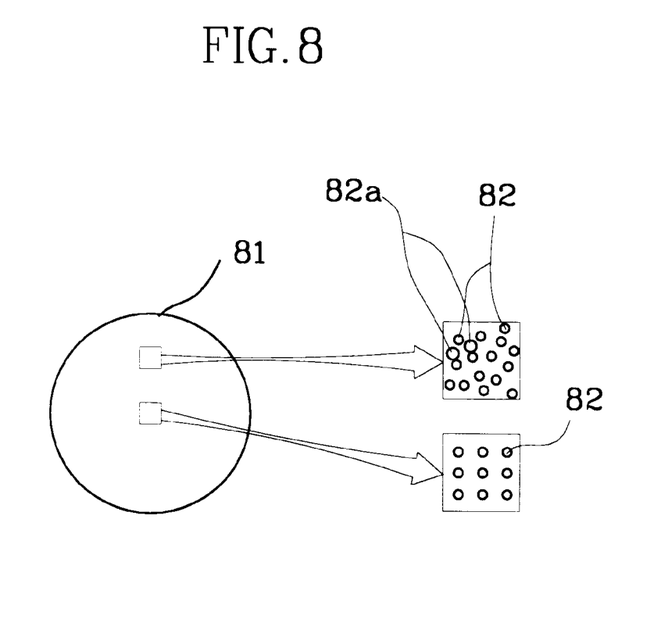
FIG. 8 is a schematic representation of the distribution density of a plurality of nozzle openings of the gas diffuser of the dry etch apparatus according to the present invention.

FIG. 8 shows the distribution of a plurality of nozzle openings 82 of the gas diffuser 81 of the dry etching apparatus according to the present invention. The gas diffuser 81 may be disposed within each of the upper electrodes 41, 51, 61, 71 as described above. As shown in FIG. 8, more nozzle openings 82 are physically distributed at the periphery of the gas diffuser 81 than at its central portion. This results in a greater flow rate at the periphery of the wafer. Therefore, the etching gas is maintained at a constant pressure over the wafer surface, even while the reactive etching (source) gas is continuously supplied and the reaction gas generated during the process is discharged from the periphery of the wafer through the sidewall of the processing chamber.

However, when it is necessary to increase the etching rate at the middle of the wafer, the distribution density of the nozzle openings 82 at the middle can be set high to increase the flow rate at the center. Moreover, instead of varying the distribution density of the nozzle openings 82, these openings 82 at a selected portion of the diffuser (e.g., the periphery) may be larger 82*a* than at other portions (e.g., the middle) to spray more gas at the selected portion. It follows that a combination of both an appropriate varying distribution density and variations in the size of the nozzle openings 82 can be employed by the gas diffuser 81 to effect an appropriately uniform etching rate.

For instance, the nozzle openings 82 can be more concentrated at the periphery of the gas diffuser 81 (FIG. 8) than at the center thereof to compensate for the discharging of the plasma particles of the etching gas from the periphery of the wafer. The size of the nozzle openings at the periphery of the gas diffuser can also be larger than those at the middle to achieve the same effect. On the other hand, when the etching process at the middle of the wafer is required or desired to be most active, the nozzle openings 82 of the gas diffuser 81 can be more concentrated and/or larger at its central portion.

Figure 9:
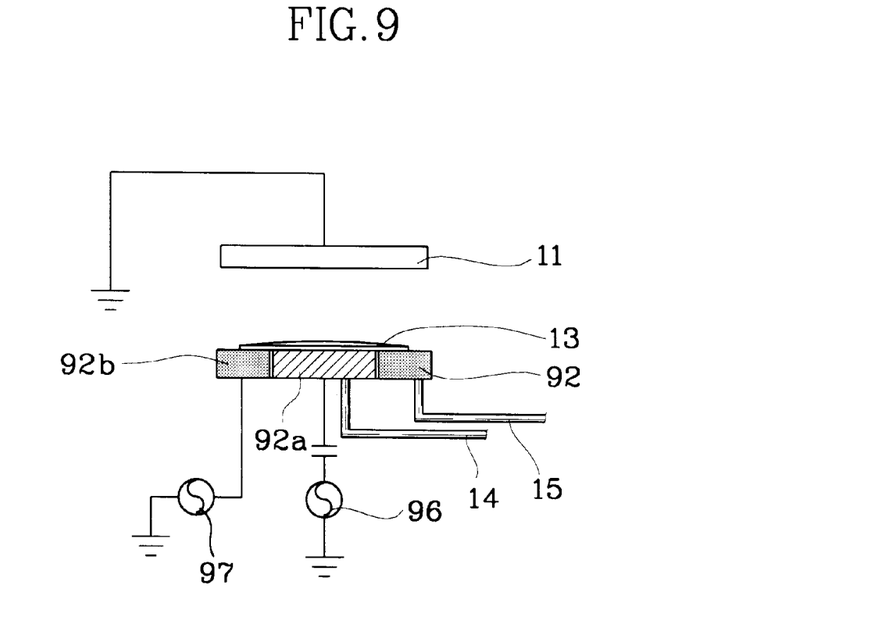
FIG. 9 is a schematic diagram, partly in section, of an embodiment of the dry etching apparatus of the present invention, wherein different RF power sources are connected to the middle and the periphery of a susceptor.

FIG. 9 is a schematic diagram, partly in section, of an embodiment of the dry etching apparatus according to the present invention, wherein different power sources are connected to the center and to the periphery of the susceptor so that different levels of RF electric field per unit area may be applied to each part. In this embodiment, different power sources 96 and 97 are connected to discrete insulated concentric sections 92*a*, 92*b* of the susceptor 92. Alternatively, the upper RF electrode 11 can be divided into discrete insulated concentric sections in which case the RF power sources would be connected to the upper electrode 11. Also, either one of the electrodes can be divided into several sections of concentric circles with a different power source being connected to each section.

Figure 10:
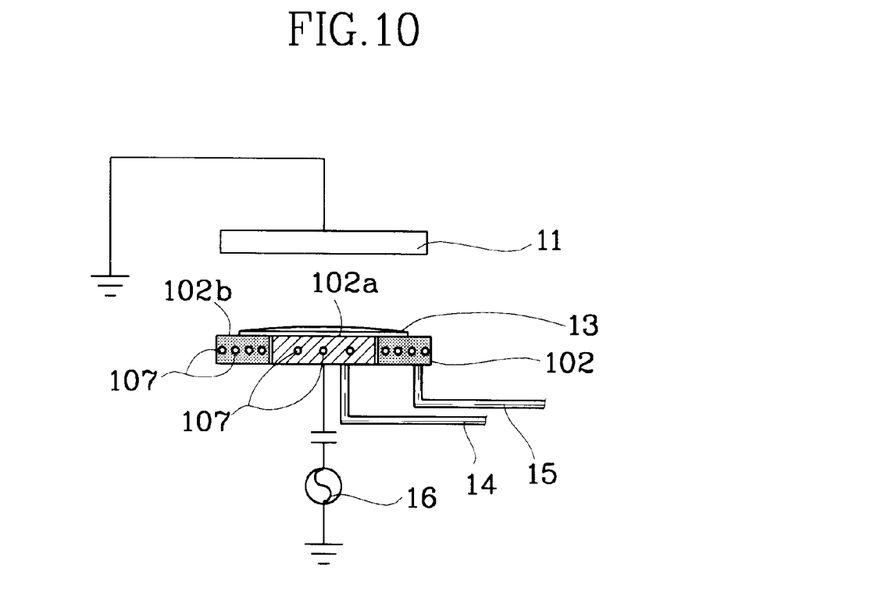
FIG. 10 is a schematic diagram, partly in section, of an embodiment of the dry etching apparatus of the present invention, wherein backside cooling helium tubes having a variable distribution density are installed at the middle and at the periphery of the susceptor.

FIG. 10 is a schematic view, partly in section, of an embodiment of the dry etching apparatus according to the present invention, wherein backside cooling helium tubes 107 are installed in different concentric sections of the susceptor 102. These tubes 107 have different distribution densities at the middle section 102*a* and edge section 102*b* of the susceptor 102. For example, there are three tubes 107 at the middle section 102*a*, and four tubes 107 at the edge section 102*b* of the susceptor 102. Therefore, the backside cooling tubes 107, using helium or water, for example, are arranged in such a manner that adjacent sections 102*a*, 102*b* of the susceptor 102 will have different temperatures during processing as determined by the number of cooling tubes 107 in each section. In this way, the wafer can be temperature-conditioned to sustain a uniform temperature therewithin which, in turn, facilitates a uniform etching of the wafer.

The foregoing embodiments of the present invention all have features designed to effect a uniform etching of the wafer, namely: an appropriately designed RF gap, a varying density of nozzle openings of the cooling gas diffuser, a divided susceptor or upper electrode with a different RF power source connected to each section, and a divided susceptor or upper electrode with varying distribution density of cooling tubes.

Figure 11:
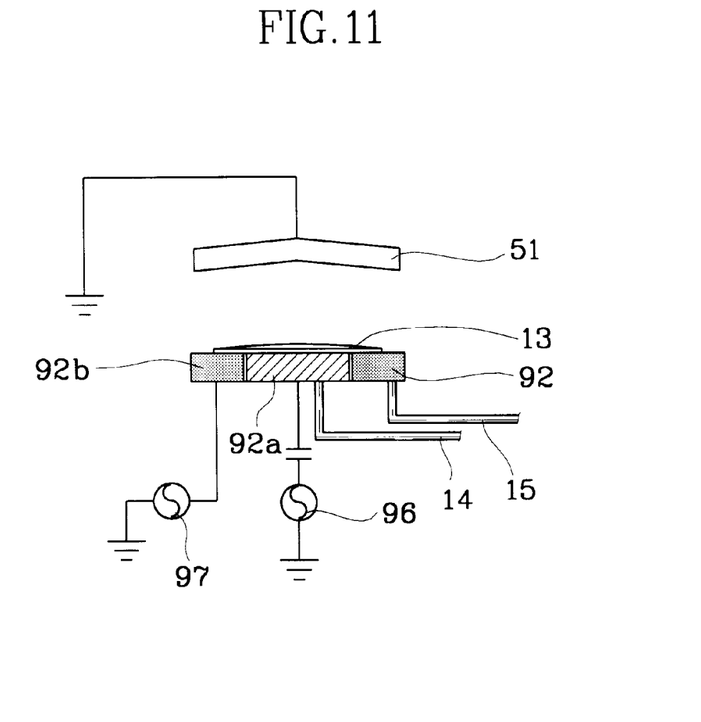
FIG. 11 is a schematic diagram, partly in section, of another embodiment of the dry etching apparatus of the present invention which combines features of the embodiments of FIGS. 5 and 9.
Figure 12:
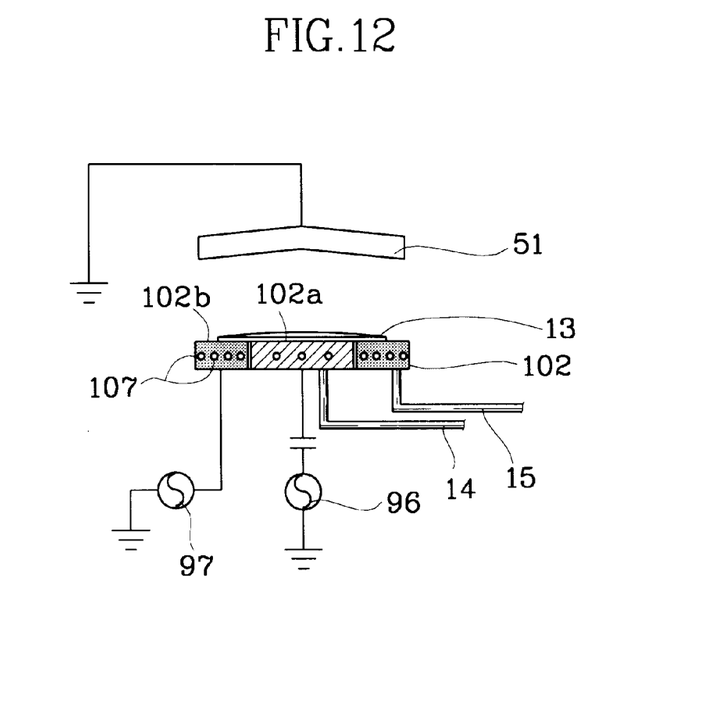
FIG. 12 is a schematic diagram, partly in section, of still another embodiment of the dry etching apparatus of the present invention which combines features of the embodiments of FIGS. 10 and 11.

One or more of these features can be employed by a single dry etching plasma apparatus. That is, if using only one feature of the above-described embodiments does not result in a sufficient etch uniformity, a combination of these features can be employed to control the etching rate of the wafer. For instance, the embodiment of FIG. 11 combines both the concave upper RF electrode 51 of the embodiment of FIG. 5, and the divided susceptor 92*a*, 92*b* and plurality of RF power sources 96, 97 of the embodiment of FIG. 9. The embodiment of FIG. 12 combines both features of the embodiment of FIG. 11 with the susceptor 102 and backside cooling tubes 107 of the embodiment of FIG. 10. In addition, the upper RF electrodes 41, 51, 61, 71 of all of the embodiments may incorporate the gas diffuser 81 as depicted in FIG. 8. Therefore, highly integrated and precise semiconductor devices can be manufactured.

It will be apparent to those skilled in the art that various modifications and variations can be made in the wafer etching method and apparatus of the present invention without departing from the spirit or scope of the invention. Thus, all such modifications and variations that come within the scope of the appended claims are seen to be within the true spirit and scope of the invention.

What is claimed is:

1. A dry etching apparatus for use in manufacturing a semiconductor device, said apparatus comprising:

upper and lower RF electrodes having respective surfaces facing each other and spaced apart from one another to define a gap therebetween, the lower RF electrode comprising a susceptor on which a wafer to be processed is to be mounted;

a cooling system associated with said susceptor; and an RF power source operatively connected to said electrodes to produce an RF electric field used to generate plasma, wherein a width of said gap between the facing surfaces of said upper and lower RF electrodes varies as taken across said surfaces such that an intensity of the RF electric field will vary in said gap as taken across said surfaces.

2. The dry etching apparatus as claimed in claim 1, wherein said surface of the upper RF electrode has a shape that is symmetrical about a point located at the center of said surface.

3. The dry etching apparatus as claimed in claim 2, wherein said surface of the upper electrode is concave.

4. The dry etching apparatus as claimed in claim 2, wherein said surface of the upper electrode is convex.

5. A dry etching apparatus for use in manufacturing a semiconductor device, said apparatus comprising:

upper and lower RF electrodes having respective surfaces facing each other and spaced apart from one another to define a gap therebetween, the lower RF electrode comprising a susceptor on which a wafer to be processed is to be mounted;

a cooling system associated with said susceptor;

an RF power source operatively connected to said electrodes to produce an RF electric field used to generate plasma; and gas diffuser means for spraying different amounts of etching gas, per unit area, from said surface of the upper RF electrode.

6. The dry etching apparatus as claimed in claim 5, wherein said gas diffuser means comprises a plurality of nozzles integral with the upper surface of said upper RF electrode, said nozzles having respective openings distributed radially from the center of said surface of the upper RF electrode, wherein said openings of the nozzles of the gas diffuser are more concentrated at a peripheral portion of said surface than at a middle portion of said surface.

7. The dry etching apparatus as claimed in claim 5, wherein a width of said gap between the facing surfaces of said upper and lower RF electrodes varies as taken across said surfaces such that an intensity of the RF electric field will vary in said gap as taken across said surfaces.

8. A dry etching apparatus for use in manufacturing a semiconductor device, said apparatus comprising:

upper and lower RF electrodes having respective surfaces facing each other and spaced apart from one another to define a gap therebetween, the lower RF electrode comprising a susceptor on which a wafer to be processed is to be mounted, one of said RF electrodes comprising a plurality of discrete sections;

cooling means for cooling said susceptor; and

RF power source means operatively connected to the discrete sections of said one of the electrodes for producing electric fields of different intensities at said sections.

9. The dry etching apparatus as claimed in claim 8, wherein said one of the RF electrodes is the lower RF electrode, and said sections are concentric.

10. The dry etching apparatus as claimed in claim 8, wherein a width of said gap between the facing surfaces of said upper and lower RF electrodes varies as taken across said surfaces such that an intensity of the RF electric field will vary in said gap as taken across said surfaces.

11. The dry etching apparatus as claimed in claim 10, wherein said upper RF electrode comprises a gas diffuser having a plurality of nozzles, said nozzles having openings directed towards said susceptor, the density of said openings of said nozzles being different at different portions of said surface of the upper RF electrode.

12. A dry etching apparatus for use in manufacturing a semiconductor device, said apparatus comprising:

upper and lower RF electrodes having respective surfaces facing each other and spaced apart from one another to define a gap therebetween, the lower RF electrode comprising a plurality of discrete sections forming a susceptor on which a wafer to be processed is to be mounted;

an RF power source means for producing an electric field used to generate plasma; and cooling means operatively associated with the discrete sections of said susceptor for cooling adjacent ones of said sections to temperatures different form each other.

13. The dry etching apparatus as claimed in claim 12, wherein said cooling means comprises a plurality of cooling tubes installed in the sections of said susceptor, and the density of said tubes varies among said adjacent ones of the discrete sections of the susceptor.

14. The dry etching apparatus as claimed in claim 12, wherein a width of said gap between the facing surfaces of said upper and lower RF electrodes varies as taken across said surfaces such that an intensity of the RF electric field will vary in said gap as taken across said surfaces.

15. The dry etching apparatus as claimed in claim 12, wherein said upper RF electrode comprises a gas diffuser having a plurality of nozzles, said nozzles having openings directed towards said susceptor, the density of said openings of said nozzles being different at different portions of said surface of the upper RF electrode.

16. The dry etching apparatus as claimed in claim 12, wherein one of said RF electrodes comprises a plurality of discrete sections, and said RF power source is operatively connected to the discrete sections of said one of the electrodes and produces electric fields of different intensities at said sections.

17. A dry etching apparatus for use in manufacturing a semiconductor device, said apparatus comprising:

upper and lower RF electrodes having respective surfaces facing each other and spaced apart from one another to define a gap therebetween, the lower RF electrode comprising a susceptor on which a wafer to be processed is to be mounted, the upper RF electrode surface having a non-planar shape that is symmetrical about a point located at the center of said surface, wherein a width of said gap between the facing surfaces of said upper and lower RF electrodes varies as taken across said surfaces such that an intensity of the RF electric field will vary in said gap as taken across said surfaces, and wherein said susceptor comprises a plurality of discrete sections;

RF power source means operatively connected to the discrete sections of said susceptor for producing RF electric fields of different intensities at said sections;

cooling means operatively associated with the discrete sections of said susceptor for cooling adjacent ones of said sections to temperatures different form each other; and gas diffuser means for spraying different amounts of etching gas, per unit area, from said surface of the upper RF electrode, wherein said gas diffuser means comprises a plurality of nozzles integral with the upper surface of said upper RF electrode, said nozzles having respective openings distributed radially from the center of said surface of the upper RF electrode, wherein a number of said openings of the nozzles of the gas diffuser at a peripheral portion of said surface and at a middle portion of said surface are different.

18. A method of dry-etching a wafer in the manufacture of a semiconductor device, said method comprising:

supporting the wafer on a surface of a susceptor which faces a surface of an upper RF electrode disposed above the susceptor in a processing chamber;

spraying cooling gas at a pressure greater than that prevailing in the processing chamber onto a backside surface of the wafer, that rests on said surface of the susceptor, at a central portion of said backside surface, whereby the wafer flexes upwardly at a central portion thereof;

introducing a reactive etching gas into a gap between said surface of the upper RF electrode and said surface of the receptor; and producing plasma having particles of a higher density at a central portion of the wafer than at a peripheral portion thereof in order to accommodate for the flexing of the wafer in uniformly etching the same.

19. The method of dry-etching a wafer as claimed in claim 18, wherein the step of producing plasma comprises generating an electric field in said gap that has a higher intensity at the central portion of the wafer than at the peripheral portion thereof.

20. The method of dry-etching a wafer as claimed in claim 18, wherein the step of producing plasma comprises spraying more of the reaction gas from a central portion of a gas diffuser located directly above the center of the wafer than from a peripheral portion of the gas diffuser located above the peripheral portion of the wafer.

21. A method of dry-etching a wafer in the manufacture of a semiconductor device, said method comprising:

supporting the wafer on the surface of a susceptor which faces the surface of an upper RF electrode disposed above the susceptor in a processing chamber;

spraying a reactive etching gas into a gap between said surface of the upper RF electrode and said surface of the receptor;

generating an electric field in said gap to react said etching gas and thereby produce plasma used for etching the wafer; and discharging the reacted gas from a sidewall of the reaction chamber at the periphery of the wafer, and wherein the spraying of the reactive etching gas comprises spraying more gas towards a central portion of the wafer than towards the periphery portion thereof to prevent the wafer from flexing convexly at the central portion thereof as the reacted gas is discharged.

22. A method of dry-etching a wafer in the manufacture of a semiconductor device, said method comprising:

providing a susceptor that is divided into a plurality of concentric sections that are insulated from each other;

supporting the wafer on a surface of the susceptor which faces a surface of an upper RF electrode disposed above the susceptor;

introducing a reactive gas into a gap between said surface of the upper RF electrode and said surface of the susceptor;

spraying reactive etching gas into said gap;

generating an electric field in said gap to react said gas and thereby produce plasma used for etching the wafer; and cooling adjacent ones of the divided sections of the susceptor to different temperatures to temperature-condition the wafer supported on the susceptor.

* * * * *